United States Patent [19]
Kim et al.

[11] Patent Number: 5,852,319
[45] Date of Patent: Dec. 22, 1998

[54] GATE ELECTRODE FOR SEMICONDUCTOR DEVICE

[75] Inventors: Young-sun Kim, Kyungki-do; Nae-in Lee, Suwon; Dae-hong Ko, Seoul, all of Rep. of Korea

[73] Assignee: Samsung Electronics Co., Ltd., Suwon, Rep. of Korea

[21] Appl. No.: 953,644

[22] Filed: Oct. 17, 1997

Related U.S. Application Data

[63] Continuation of Ser. No. 580,462, Dec. 28, 1995, abandoned.

[30]    Foreign Application Priority Data

Dec. 28, 1994  [KR]   Rep. of Korea ...................... 94-38281

[51] Int. Cl.$^6$ ................................................. H01L 27/088
[52] U.S. Cl. ........................... 257/412; 257/413; 257/900
[58] Field of Search ................................... 257/412, 413, 257/900

[56]    References Cited

U.S. PATENT DOCUMENTS

| | | | |
|---|---|---|---|
| 4,874,717 | 10/1989 | Neppl et al. | 257/412 X |
| 5,115,290 | 5/1992 | Murakami et al. | 257/412 X |
| 5,341,016 | 8/1994 | Prall et al. | 257/412 |

FOREIGN PATENT DOCUMENTS

| | | | |
|---|---|---|---|
| 61-166075 | 7/1986 | Japan | 257/412 |
| 63-284857 | 11/1988 | Japan | 257/412 |
| 2192161 | 7/1990 | Japan | 257/412 |

*Primary Examiner*—William Mintel
*Attorney, Agent, or Firm*—Jones & Volentine, L.L.P.

[57]    ABSTRACT

A gate electrode in a semiconductor device comprising; a gate oxide layer formed on a semiconductor substrate, a polysilicon layer formed on the gate oxide layer, a silicide layer formed on the polysilicon layer and, a metal silicide layer formed on the silicide layer.

5 Claims, 5 Drawing Sheets

GATE ELECTRODE FOR SEMICONDUCTOR DEVICE

This application is a continuation of application Ser. No. 08/580,462 filed Dec. 28, 1995, now abandoned.

BACKGROUND OF THE INVENTION

The present invention relates to a semiconductor device, and more particularly, to a gate electrode in a semiconductor device having low resistance and imparting high insulation breakdown voltage characteristics to the gate oxide layer. The present invention also relates to a method for forming such a gate electrode.

As semiconductor devices become more highly integrated, the need for gate electrodes having reduced specific resistance increases. Research into gate electrodes having reduced specific resistance has focused on the formation of such from titanium silicide ($TiSi_2$) deposited on polysilicon. This structure is often referred to as a polycide structure.

FIGS. 1A–1C are cross-sectional views illustrating the formation of a gate electrode using a conventional method. In this conventional method, a gate oxide layer 4, a polysilicon layer 6 and a titanium (Ti) layer 8 are sequentially deposited on a semiconductor substrate 2 (FIG. 1A). Thereafter, the resultant structure is heat-treated in a nitrogen ($N_2$) atmosphere 10 to cause a reaction between polysilicon layer 6 and titanium (Ti) layer 8 (FIG. 1B). The reaction forms a titanium silicide layer 12 (FIG. 1C). The polysilicon layer 6 and titanium silicide layer 12 are then patterned to form a gate electrode (not shown) after which a heat-treating or annealing process is performed on the resultant structure.

According to the foregoing method, a gate electrode having reduced specific resistance is formed from a titanium silicide ($TiSi_2$) layer formed over a polysilicon layer. This structure enjoys several performance advantages over previous gate electrode structures, but it also has certain drawbacks.

For example, after formation of the titanium silicide layer 12, the annealing heat-treatment causes an agglomeration phenomenon which may actually increase the resistance of the gate electrode. Additionally, the titanium present in titanium silicide layer 12 diffuses into gate oxide layer 4 and reduces the breakdown voltage of this layer, thereby degrading the reliability of the semiconductor device.

SUMMARY OF THE INVENTION

The present invention provides a gate electrode for a semiconductor device in which the silicide agglomeration phenomenon does not occur, and the reliability of the gate oxide layer is not adversely impacted.

To accomplish the foregoing, the present invention provides in one aspect a gate electrode for a semiconductor device comprising; a gate oxide layer formed on a semiconductor substrate, a polysilicon layer formed on the gate oxide layer, a silicide layer formed on the polysilicon layer and, a metal silicide layer formed on the silicide layer.

In another aspect, the present invention provides a method of forming a gate electrode in a semiconductor device, comprising the steps of; forming a gate oxide layer over a semiconductor substrate, forming a first polysilicon layer over the gate oxide layer, forming a silicide layer over the first polysilicon layer, forming a second polysilicon layer over the silicide layer, forming a metal layer over the second polysilicon layer, forming a metal silicide layer by reaction of the metal layer with the second polysilicon and, heat-treating the resulting structure including the metal silicide layer.

In yet another aspect, the present invention provides a method of forming a gate electrode in a semiconductor device, comprising the steps of; forming a gate oxide layer over a semiconductor substrate surface, forming a first polysilicon layer over the gate oxide layer, forming a silicide layer over the first polysilicon layer, forming a second polysilicon layer over the silicide layer, patterning the structure resulting from the formation of the gate oxide layer, first polysilicon layer, silicide layer and second polysilicon layer to form a gate electrode structure having an upper surface terminated a residual portion of the second polysilicon layer and side walls, and to expose a portion of the semiconductor substrate surface, forming an insulating material over gate electrode structure and the exposed portion of the semiconductor substrate surface, etching the insulating material to form side wall spacers covering the side walls of the gate electrode structure, forming a metal layer over the upper surface of the gate electrode structure, the side wall spacers and the exposed portion of the semiconductor substrate surface and, reacting the metal layer with the upper surface of the gate electrode structure and the exposed portion of the semiconductor substrate surface to form first and second metal silicide layers respectively.

In the present invention, the silicide layer is preferably formed of a metal silicide having a high melting point selected from the group consisting of tungsten silicide ($WSi_x$), tantalum silicide ($TaSi_2$) and molybdenum silicide ($MoSi_2$). More specifically, the silicide layer comprises tungsten silicide ($WSi_x$) formed by reacting $WF_6$ with $SiH_4$ or $SiH_2Cl_2$. The metal silicide layer is preferably formed of titanium silicide ($TiSi_2$), tantalum silicide ($TaSi_2$), cobalt silicide ($CoSi_2$), or molybdenum silicide ($MoSi_2$).

BRIEF DESCRIPTION OF THE DRAWINGS

The benefits and advantages of the present invention will become more apparent upon consideration of several preferred embodiments with reference to the attached drawings in which.

DETAILED DESCRIPTION OF THE INVENTION

Figure 1A:
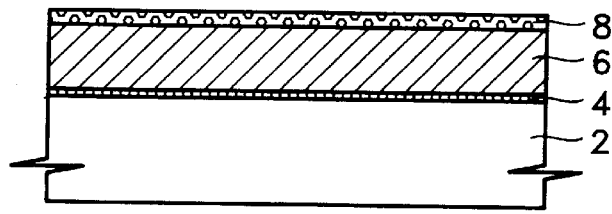
FIGS. 1A–1C are cross-sectional views illustrating the formation of a gate electrode according to a conventional method.
Figure 1B:
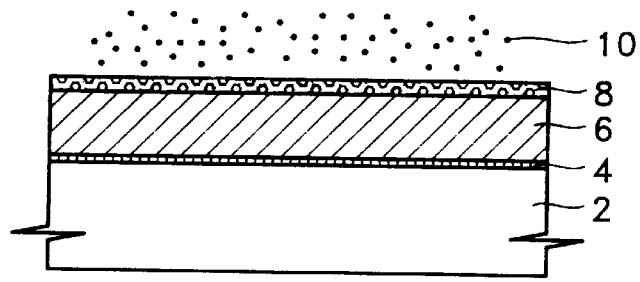
Figure 1C:
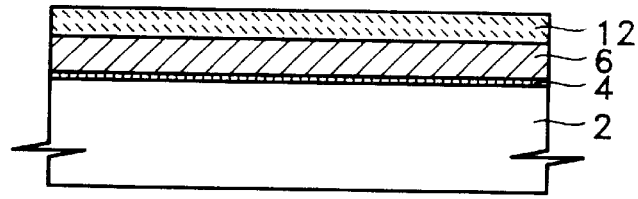
Figure 2:
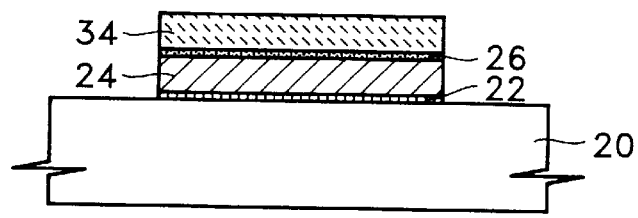
FIG. 2 is a cross-sectional view showing a gate electrode formed by a method according to the present invention.

In FIG. 2, reference numeral 20 denotes a semiconductor substrate, reference numeral 22 denotes a gate oxide layer, reference numeral 24 denotes a polysilicon layer, reference numeral 26 denotes a silicide layer, and reference numeral 34 denotes a metal silicide layer. Here, silicide layer 26 is formed from a metal silicide having a high melting point, such as tungsten silicide (WSi$_x$), tantalum silicide (TaSi$_2$), or molybdenum silicide (MoSi$_2$). The metal silicide layer 34 is preferably formed of titanium silicide (TiSi$_2$), tantalum silicide (TaSi$_2$), cobalt silicide (CoSi$_2$) or molybdenum silicide (MoSi$_2$).

In the gate electrode formed according to the present invention, low-resistance metal layer 34, being formed of a material having a low specific resistance, reduces the overall resistance of the gate electrode. Further, silicide layer 26 prevents the Ti, Ta, Co and Mo particles from low-resistance metal layer 34 from diffusing into gate oxide layer 22, and prevents the silicon atoms from polysilicon layer 24 from diffusing into low-resistance metal layer 34. Accordingly, the agglomeration phenomenon does not arise in subsequent processing steps.

Figure 3A:
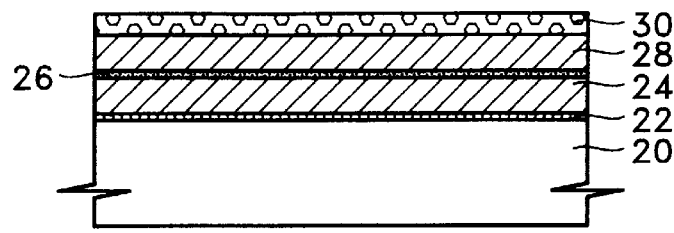
FIGS. 3A through 3D are cross-sectional views illustrating the formation of a gate electrode according to a first embodiment of the present invention.

FIG. 3A illustrates the first steps in the formation of gate electrode according to the present invention. In FIG. 3A, a gate oxide layer 22, first polysilicon layer 24, a silicide layer 26, a second polysilicon layer 28 and a metal layer 30 are sequentially formed over a semiconductor substrate 20. The gate oxide layer 22 is preferably an insulating layer of silicon dioxide formed on semiconductor substrate 20, and first polysilicon layer 24 is formed of a polysilicon material containing impurities such as phosphorus (P) ions. Metal layer 30 is preferably formed from Ti, but may also be formed from Co, Ta or Mo.

Silicide layer 26 is formed from a combination of a high-melting-point material and a material which prevents particles from metal layer 30 from diffusing into first polysilicon layer 24. Silicide layer 26 is preferably formed of WSi$_x$, but may also be formed of TaSi$_2$ or MoSi$_2$. Moreover, silicide layer 26 prevents silicon from first polysilicon layer 24 from diffusing into metal silicide layer 34 (subsequently formed) during an annealing step later applied to the resultant structure, thereby preventing the agglomeration phenomenon of metal silicide layer 34.

Figure 3B:
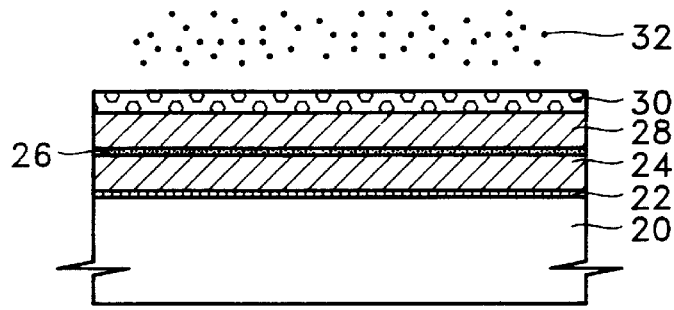

FIG. 3B shows the heat-treatment process applied to form metal silicide layer 34. For the present embodiments, heat-treatment at a temperature of 850° C. was applied to the materials forming silicide material layer 34 for 120 minutes in an atmosphere of nitrogen (N$_2$) 32.

Figure 3C:
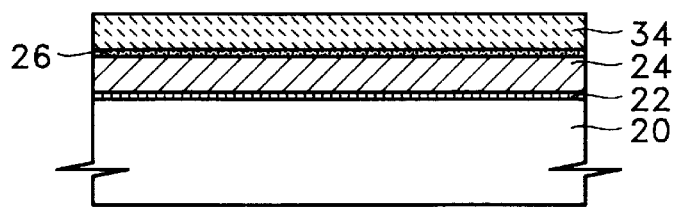

FIG. 3C shows the metal silicide layer 34 formed on silicide layer 26 by the step shown in FIG. 3B.

Figure 3D:
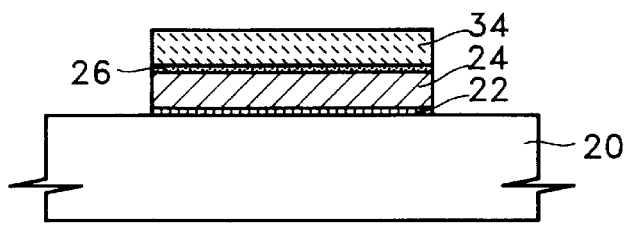

FIG. 3D illustrates the formation the gate electrode, wherein metal silicide layer 34 and all other material layers deposited on semiconductor substrate 20 are etched to complete the gate electrode structure.

Thus, in the gate electrode formed according to the first embodiment of the present invention, silicide layer 26 is formed between metal silicide layer 34 and first polysilicon layer 24. Silicide layer 26 prevents silicon from first polysilicon layer 24 from being diffused into metal silicide layer 34, which prevents the agglomeration phenomenon of metal silicide layer 34 from occurring during the subsequent heat treatment step. Furthermore, silicide layer 26 prevents particles from metal silicide layer 34 from diffusing into gate oxide layer 22 and reducing the breakdown voltage of this layer.

FIGS. 4A through 4E are cross-sectional views illustrating the formation of a gate electrode according to a second embodiment of the present invention. Here, in contrast to the first embodiment in which the gate electrode is patterned after the formation of metal silicide layer 34, the second embodiment forms a metal silicide layer after gate electrode patterning occurs.

Figure 4A:
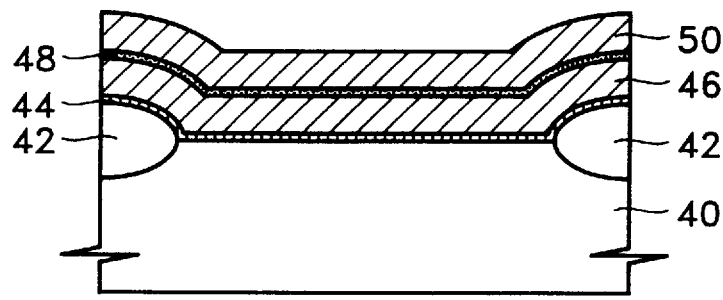
FIGS. 4A through 4E are cross-sectional views illustrating the formation of a gate electrode according to a second embodiment of the present invention.

With reference to FIG. 4A, a field oxide layer 42 separates semiconductor substrate 40 into an active region and a non-active region. Thereafter, a gate oxide layer 44, a first polysilicon layer 46, a silicide layer 48, and a second polysilicon layer 50 are sequentially formed over the entire surface of semiconductor substrate 40.

Figure 4B:
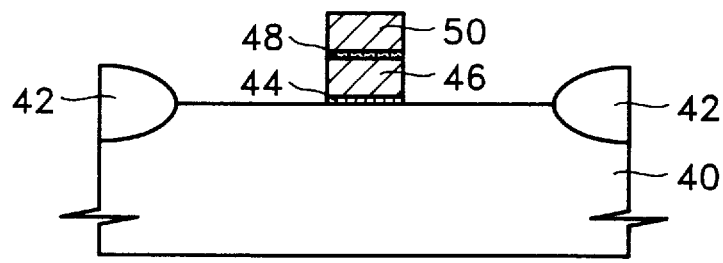

In FIG. 4B, the foregoing structure is patterned using well-known techniques.

Figure 4C:
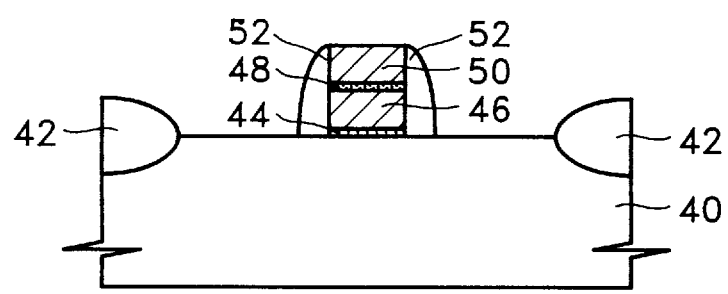

As shown in FIG. 4C, an insulation layer, such as silicon dioxide, is deposited over the surface of the patterned structure shown in FIG. 4B. The insulation layer is thereafter anisotropically etched to form a side wall spacer(s) 52 on either side wall of the patterned gate electrode structure.

Figure 4D:
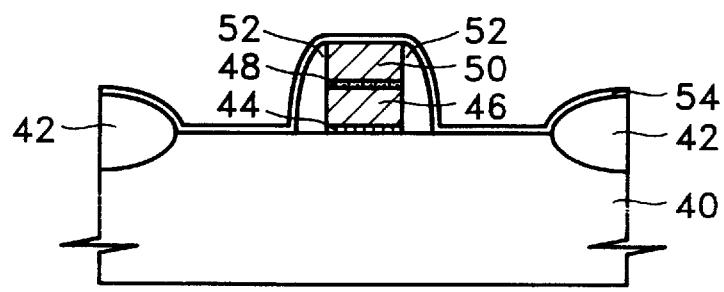

Then, a metal layer 54, such as the one described in connection with FIG. 3B, is deposited over the surface of the foregoing structure as shown in FIG. 4D.

Figure 4E:
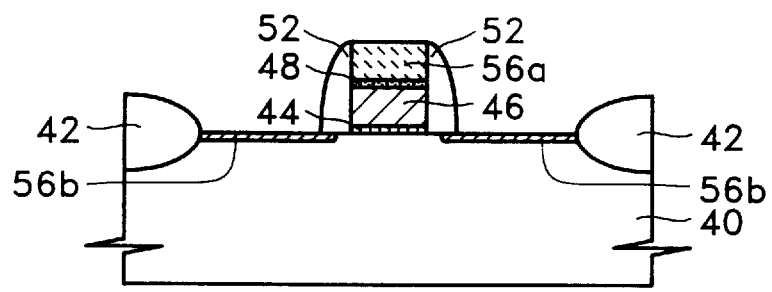

Next as shown in FIG. 4E, the resulting structure is heat-treated in a nitrogen atmosphere to form first and second metal silicide layers, 56a and 56b. Here, first metal silicide layer 56a is formed over silicide layer 48 by a reaction of second polysilicon layer 50 with metal layer 54. Second metal silicide layer 56b is formed over exposed portions of the surface of semiconductor substrate 40 by a reaction of semiconductor substrate 40 with metal layer 54.

Figure 5A:
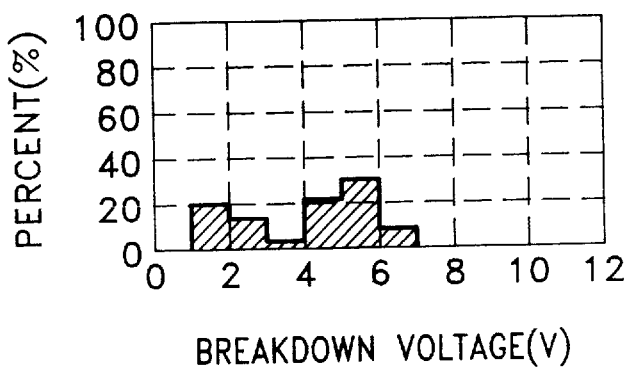
FIGS. 5A and 5B are graphs comparing the voltage breakdown characteristics of gate electrodes formed by the conventional method and by the present invention.
Figure 5B:
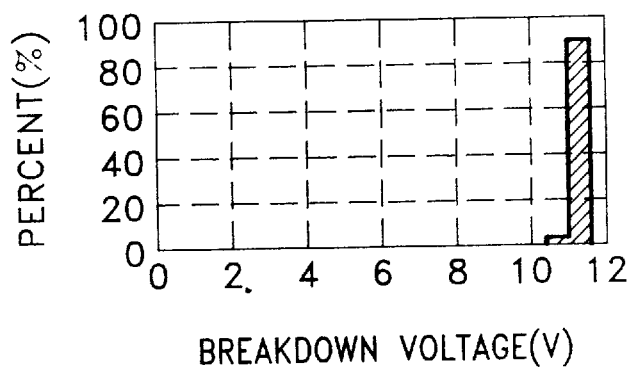

FIGS. 5A and 5B are graphs comparing the distribution of voltage breakdown characteristics for a sample of 100 devices adopting gate electrodes formed by the conventional method and by the present invention. FIG. 5A illustrates the results for a case wherein TiSi$_2$ is deposited on polysilicon to form a gate electrode according to a conventional method. FIG. 5B illustrates results for a case wherein the gates electrode was formed according to the present invention.

The breakdown voltage for the samples shown in FIG. 5B is much higher than that for the samples shown in FIG. 5A where the breakdown voltage generally drops to 6 V or less. That is to say, a gate electrode formed by the present invention is more reliable than one formed by the conventional method.

The foregoing embodiments have been given by way of example. The present invention is not limited to these embodiments and various modifications may be effectuated by one having ordinary skill in the art which fall within the scope of the invention as set forth in the appended claims.

What is claimed is:

1. A gate electrode in a semiconductor device, comprising:

a gate oxide layer formed on a semiconductor substrate;

a polysilicon layer formed on the gate oxide layer;

a first silicide layer having a first melting point formed over the polysilicon layer; and a second silicide layer having a second melting point formed between the polysilicon layer and the first silicide layer, to prevent metal particles from contaminating the gate oxide layer and to prevent silicon particles from contaminating the first silicide layer, wherein the second melting point is higher than the first melting point.

2. The gate electrode of claim 1, wherein the second silicide layer comprises one selected from a group consisting of: tungsten silicide (WSi$_x$), tantalum silicide (TaSi$_2$) and molybdenum silicide (MoSi$_2$).

3. The gate electrode of claim 1, wherein the first silicide layer comprises one selected from a group consisting of: titanium silicide (TiSi$_2$), tantalum silicide (TaSi$_2$), cobalt silicide (CoSi$_2$), and molybdenum silicide (MoSi$_2$).

4. A gate electrode in a semiconductor device, comprising:

a gate oxide layer formed on a semiconductor substrate;

a polysilicon layer formed on the gate oxide layer;

a titanium silicide layer formed over the polysilicon layer; and a metal silicide layer having a higher melting point than that of titanium silicide formed between the polysilicon layer and the titanium silicide layer, to prevent titanium particles from contaminating the gate oxide layer and to prevent silicon particles from contaminating the titanium silicide layer.

5. The gate electrode of claim 4, wherein the metal silicide layer comprises one selected from a group consisting of: tungsten silicide ($WSi_x$), tantalum silicide ($TaSi_2$) molybdenum silicide ($MoSi_2$).

* * * * *